United States Patent
Tofano (10) Patent No.: US 8,489,611 B2
(45) Date of Patent: Jul. 16, 2013

(54) DELTA CHUNKS AND DELTA HASHES

(76) Inventor: Jeffrey Vincent Tofano, San Jose, CA (US)

( * ) Notice: Subject to any disclaimer, the term of this patent is extended or adjusted under 35 U.S.C. 154(b) by 89 days.

(21) Appl. No.: 13/182,495

(22) Filed: Jul. 14, 2011

(65) Prior Publication Data

US 2012/0016882 A1    Jan. 19, 2012

(51) Int. Cl.
*G06F 7/00* (2006.01)
*G06F 17/30* (2006.01)

(52) U.S. Cl.
CPC .. *G06F 7/00* (2013.01); *G06F 17/30* (2013.01)
USPC .......................................... 707/741; 707/747

(58) Field of Classification Search
None
See application file for complete search history.

(56) References Cited

U.S. PATENT DOCUMENTS

| | | | | |
|---|---|---|---|---|
| 8,140,821 B1 * | 3/2012 | Raizen et al. | ................. | 711/202 |
| 8,156,306 B1 * | 4/2012 | Raizen et al. | ................. | 711/202 |
| 8,250,325 B2 * | 8/2012 | Holdman et al. | ............. | 711/162 |
| 2007/0282829 A1 * | 12/2007 | Fontoura et al. | ................. | 707/5 |
| 2011/0040728 A1 * | 2/2011 | Akirav et al. | ................. | 707/634 |
| 2011/0113012 A1 * | 5/2011 | Gruhl et al. | ................. | 707/646 |
| 2011/0246741 A1 * | 10/2011 | Raymond et al. | ............. | 711/170 |
| 2011/0276744 A1 * | 11/2011 | Sengupta et al. | ............. | 711/103 |
| 2011/0307447 A1 * | 12/2011 | Sabaa et al. | ................... | 707/637 |

* cited by examiner

*Primary Examiner* — Jay Morrison (57) ABSTRACT

Example apparatus, methods, and computers control processing delta chunks with delta hashes. One example method includes computing a first hash for a chunk for which a duplicate determination is to be made. The first hash is suitable for making the duplicate chunk determination. The method also includes computing a delta hash for the chunk. The delta hash is suitable for making a delta chunk determination. The method controls a de-duplication logic to process the chunk as a duplicate upon determining that the first hash matches a stored first hash. The method controls the de-duplication logic to process the chunk as a delta chunk upon determining that the first hash does not match a stored first hash and that the delta hash matches a stored delta hash. Processing a chunk as a delta chunk may include storing a reference to a stored chunk and storing delta hash information.

9 Claims, 8 Drawing Sheets

DELTA CHUNKS AND DELTA HASHES

CROSS REFERENCE TO RELATED APPLICATION

This application claims priority to United Kingdom Patent Application No. 1012107.7 filed on Jul. 19, 2010, the disclosure of which is incorporated herein by reference in its entirety.

BACKGROUND

Conventional data de-duplication (dedupe) involves identifying whether two chunks of data are identical. Identical data does not need to be stored or transmitted. Instead, information (e.g., a reference) identifying identical data can be stored or transmitted. When the information about the data consumes less space or transmission bandwidth than the data, then space or transmission bandwidth is saved.

Conventional dedupe tends to operate in a binary manner. Either a chunk is a duplicate or a chunk is not a duplicate. Duplicate chunks are not stored, unique chunks are stored. Additionally, conventional dedupe tends to rely on strong, wide cryptographic hashes to determine whether chunks are duplicates. Storing or transmitting strong, wide cryptographic hashes consumes at least a part of the memory and/or bandwidth that dedupe is trying to save. Furthermore, indexing chunks based on strong, wide cryptographic hashes can consume limited random access memory (RAM). When a large number of chunks are indexed with wide cryptographic hashes, the index can consume more memory than is available in an indexing machine.

Storage space for storing chunks and for storing indexing material is limited. While plentiful storage (e.g., disk, tape) may be suitable for storing chunks, less plentiful storage (e.g., random access memory (RAM)) may be suitable for storing indexing material and/or fingerprints (e.g., cryptographic hashes). Conventional indexes may have grown so large that they overflowed memory and required portions of the indexing material to be stored elsewhere (e.g., on disk). Storing indexing material on disk can slow down duplicate determinations. Attempts to store larger chunks may have lead to fewer duplicate chunks being found. Attempts to store wide cryptographic hashes may have increased the amount of memory and/or disk space required to store indexing material. Attempts to store smaller chunks may have lead to more duplicate chunks being found, but at the expense of storing more cryptographic hashes. Conventional systems may have wrestled with competing goals of being able to quickly determine whether a chunk is a duplicate using in memory indexing material while at the same time storing less data and indexing material.

BRIEF DESCRIPTION OF THE DRAWINGS

The accompanying drawings, which are incorporated in and constitute a part of the specification, illustrate various example methods, apparatuses, and other example embodiments of various aspects of the invention described herein. It will be appreciated that the illustrated element boundaries (e.g., boxes, groups of boxes, other shapes) in the figures represent one example of the boundaries of the elements. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Example apparatus and methods produce multiple hashes for an object (e.g., chunk) and then make duplicate determinations and delta determinations based on the multiple hashes. A duplicate determination concerns whether a chunk being processed has been encountered before. A delta determination concerns whether a chunk being processed is similar to a chunk that has been encountered before. Example apparatus and methods also selectively produce, store, and/or transmit delta chunks for chunks that are not duplicates. A delta chunk is a chunk that knows that it is different than a stored chunk and also knows how it is different from a stored chunk. A conventional chunk may have no self-awareness and may simply be treated as a duplicate or as a unique chunk.

A delta chunk is not just a record of byte differentials between two chunks. A delta chunk knows that it is similar to a stored chunk and knows about rules that can be applied to the stored chunk to create the delta chunk. Thus, in one embodiment, a delta chunk stores a reference to a stored chunk and a rule for how to recreate the delta chunk from the stored chunk. In one embodiment, data stored for a delta chunk may also include a delta hash value and/or delta hash identifier. The delta hash value and/or identifier may provide insight into how the chunk came to realize that it was different from but similar to a stored chunk. This insight can guide future duplicate and/or delta decisions for a chunk for which a duplicate and/or delta determination is being made.

Example apparatus and methods may produce a strong, wide cryptographic hash for an object. Example systems may also produce more narrow, weaker hashes for portions of an object. These additional hashes may be referred to as delta hashes because they are used to determine whether a delta chunk should be created, stored, and/or transmitted. By way of illustration, a first narrow, weak delta hash may be computed for the first half of a file and a second narrow, weak delta hash may be computed for the second half of a file. Both the strong cryptographic hashes and the more narrow, weaker hashes may be compared to stored hashes to identify duplicate chunks and/or similar chunks. When two objects are identical, the strong, wide cryptographic hashes will match. A cryptographic hash match will lead to a chunk being treated as a duplicate. When two objects are not identical, the strong wide cryptographic hashes will likely not match. Instead of automatically treating the chunk as a new chunk, comparisons of delta hashes may reveal that the chunk is similar to a stored chunk. When a chunk is similar to a stored chunk, then a delta chunk may be stored rather than treating the chunk as a new chunk.

If two chunks only differ in a few locations, and if those locations are confined to certain regions of the chunk, then one or more of the delta hashes may match delta hashes associated with stored chunks while other delta hashes may not match. In one example, if a threshold number of delta hashes match stored delta hashes, then the chunk may be treated as a delta chunk. In another embodiment, subsequent delta hashes may be computed based on comparisons of previously computed delta hashes to stored hashes. These additional delta hashes may then be compared for increasingly smaller subsections of the non-matching portion. Delta hashes may also be computed for other views of an object. In one example, a delta hash may be computed for every other character in an object, for every third character in an object, and so on. In another example, a delta hash may be computed for every 1 k block in an object. In another example, a delta hash may be computed for each boundary delimited region in an object. One skilled in the art will appreciate that a variety of different hashes can be computed for an object.

In one example the different hashes can be computed when an object is encountered. In another example, additional hashes can be computed in an ongoing manner in response to a match or mismatch of a previously computed hash. By way of illustration, an object may first be divided into quarters. If the cryptographic hash for the entire object does not match, but three of the four narrow hashes computed for the quarters of the object do match, then the quarter for which there is a narrow hash mismatch may be processed further. The further processing may include further subdividing the quarter into quarters and then repeating the division and hashing until a similarity determination can be made. The additional processing may involve performing comparisons (e.g., character by character, byte by byte, bit by bit) to determine how alike or how different the portions are. Based on the further processing, a decision may be made to classify the chunk as a unique chunk and thus to store the chunk or a decision may be made to classify the chunk as a candidate for delta storage. While repeatedly subdividing into quarters is described, one skilled in the art will appreciate that other divisions may be employed.

Examining common data storage situations provides insight into dedupe and how delta chunks can enhance conventional dedupe. One classic wasteful data storage situation involves storing an original word processor file and storing an edited copy of the file that has exactly one edit. Consider a 100 k word processor file that was missing one period at the end of one sentence and that was edited to include the period. A conventional system that worked with fixed 100 k block sizes may store both the original 100 k file and the edited 100 k file because the two objects are not identical. This conventional system would store 200 k of data and two cryptographic hashes.

One conventional dedupe system would likely break the 100 k file into smaller chunks (e.g., 1 k chunks). The conventional dedupe system would not store duplicate 1 k chunks but would store two versions of the edited 1 k chunk. Therefore the conventional dedupe system would store 101 k of data. However, this conventional dedupe system would also store 101 different cryptographic hashes. A wide cryptographic hash may be, for example, 128 bits, 1 k bits, and so on. When chunks get small and hashes stay large, the ratio of stored data to stored hashes may lead to inefficiencies.

Example apparatus and methods may improve on the conventional dedupe system described in the preceding paragraph. Instead of breaking a larger file (e.g., the 100 k file) into smaller fixed size pieces (e.g., 1 k chunks), one example method may logically break the larger file into smaller pieces using delta hashes. A first delta hash may be computed for one half of the file and a second delta hash may be computed for a second half of the file. The delta hashes can then be used to decide whether differences are confined to one half. If the differences are confined to one half, then the identical halves can be treated as duplicates. The half in which the edits appear may then be divided again and again while differences can be confined to certain regions. This example would store less than 200 k of data but may store more than 101 k of data. However, this example would store less than one hundred and one wide cryptographic hashes. Instead, this example may only store two wide cryptographic hashes and a small set of narrow cryptographic hashes yielding a saving in data stored, indexing complexity, and indexing area required.

A number of delta hashes may be computed for an object. Example delta hashes may include, for example, hashes for fixed portions of the object, hashes for patterns (e.g., alternating characters) in the object, hashes for variable sized portions of the object, hashes for unique portions of an object, hashes for overlapping portions of an object, and so on. Based on the observation that the cryptographic hash does not match a stored cryptographic hash and that therefore the two objects are not identical, a comparison of delta hashes may reveal that the objects are similar in certain regions and differ in other regions. Based on an analysis of how similar the objects are, a different type of chunk known as a delta chunk may be created and stored or transmitted. The delta chunk may include a reference to a stored chunk and rules for creating a chunk from a stored chunk.

The following includes definitions of selected terms employed herein. The definitions include various examples and/or forms of components that fall within the scope of a term and that may be used for implementation. The examples are not intended to be limiting.

References to "one embodiment", "an embodiment", "one example", "an example", and other similar terms indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" or "in one example" does not necessarily refer to the same embodiment or example.

Figure 1:
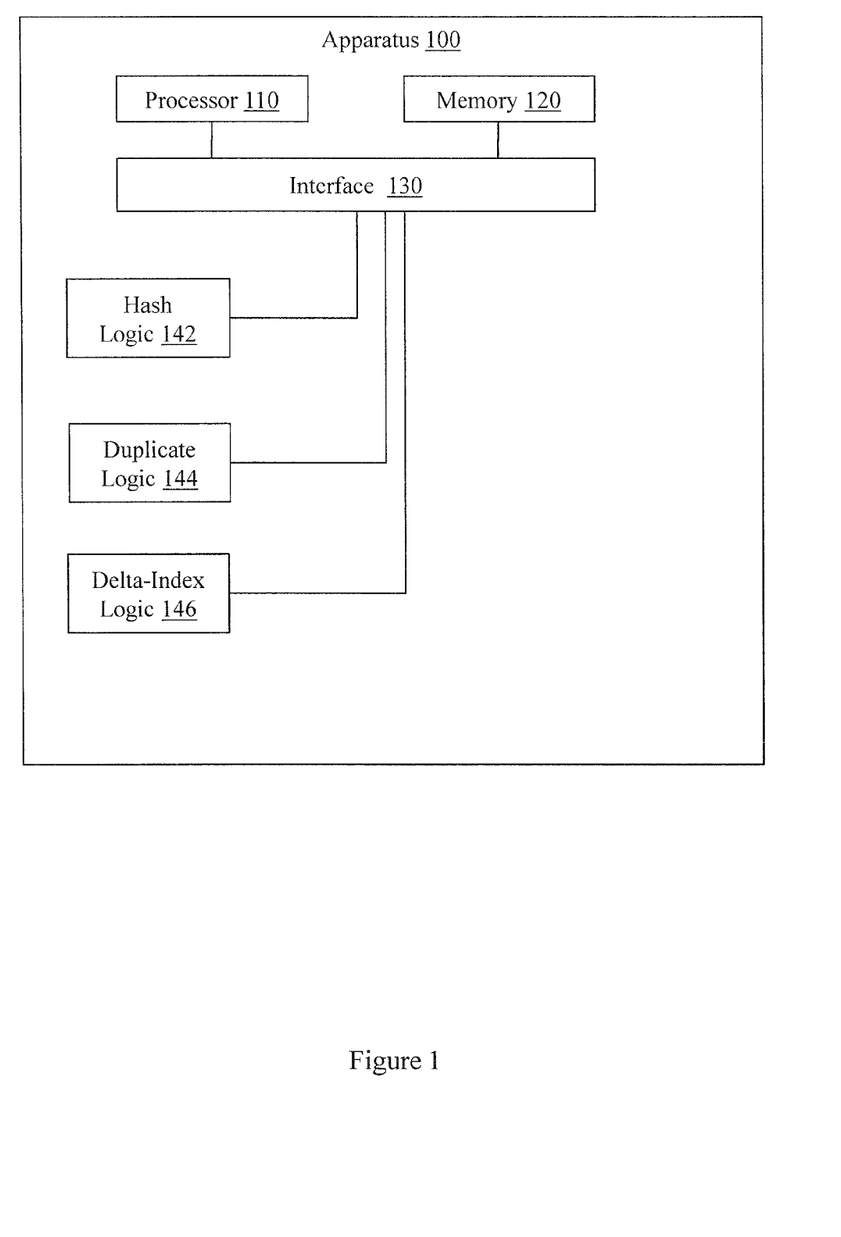
FIG. 1 illustrates an embodiment of an apparatus associated with delta chunks and delta hashes.

FIG. 1 illustrates an apparatus 100. Apparatus 100 includes a processor 110, a memory 120, and an interface 130 to connect the processor 110, the memory 120, and a set of logics. In one embodiment, the set of logics includes a hash logic 142, a crypto-index logic 144, and a delta-index logic 146. In different embodiments, the logics may be, for example, circuits, integrated circuits, application specific integrated circuits (ASICs), and other entities.

In one embodiment, the hash logic 142 is configured to produce a duplicate hash for a chunk. The duplicate hash may be, for example, a strong, wide cryptographic hash. The hash logic 142 may also be configured to produce one or more delta hashes for the chunk. The delta hashes may be more narrow than the duplicate hash and may be less strong than the duplicate hash. Thus, rather than compute a single cryptographic hash and search an index associated with cryptographic hashes to determine whether a chunk is a duplicate based solely on that single cryptographic hash, multiple hashes may be computed. Since multiple hashes are computed, multiple different decisions can proceed, in some cases in parallel, to facilitate determining whether a chunk is a duplicate, unique, or delta chunk.

The crypto-index logic 144 may be configured to determine whether the chunk is a duplicate based on the duplicate hash. The delta-index logic 146 may be configured to determine whether the chunk is to be processed as a delta chunk as a function of the one or more delta hashes. In one embodiment, processing the chunk as a delta chunk includes not storing the chunk as a unique chunk and not storing information describing the chunk as a duplicate chunk but rather storing information about the delta chunk. This information may include, for example, location information for a stored chunk from which the delta chunk can be recreated and recreation information that describes how to produce the chunk from the stored chunk. The recreation information can be used recreate the chunk from a stored chunk referenced by the location information. The recreation may be based, for example, on a rule that describes edits to a stored chunk that will produce the chunk.

In one embodiment, the hash logic 142 is configured to produce the duplicate hash and the one or more delta hashes in parallel. Thus, a strong, wide cryptographic hash may be produced at the same time as the delta hashes are produced. Therefore a set of hashes rather than just a single hash may be available to help characterize the chunk. The duplicate hash facilitates determining whether the chunk is a duplicate while the delta hashes facilitate determining whether the chunk is a unique chunk or whether the chunk is similar enough to another chunk to be processed as a delta chunk.

In one embodiment, the crypto-index logic 144 and the delta-index logic 146 are configured to operate in parallel. Thus, a duplicate determination and a delta chunk determination may proceed in parallel. A definitive answer in one of the parallel searches facilitates early termination of other searches in progress. The crypto-index logic 144 may access one index while the delta-index logic 146 accesses a different index or indexes. For example, the crypto-index logic 144 may access a primary index while the delta-index logic 146 may access a temporal index. The primary index and the temporal index may reside in different memories.

Figure 2:
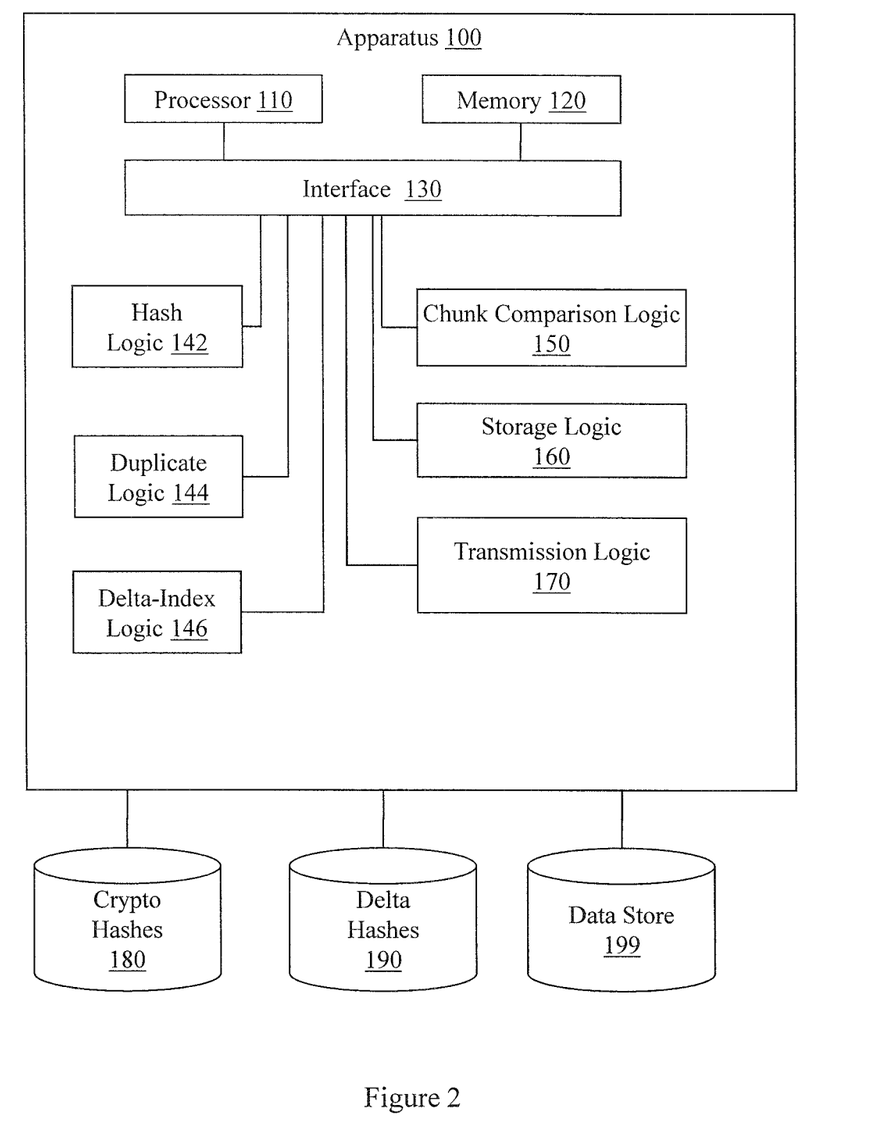
FIG. 2 illustrates an embodiment of an apparatus associated with delta chunks and delta hashes.

FIG. 2 illustrates another embodiment of apparatus 100. In this embodiment of apparatus 100, the crypto-index logic 144 is configured to search an index 180 that stores crypto-hashes (e.g., cryptographic hashes, fingerprints, wide hashes). The index 180 may be stored in memory, on disk, and on a combination thereof. In this embodiment of apparatus 100, the delta-index logic 146 is configured to search an index 190 that stores delta hashes. The delta hashes may also be stored in memory, on disk, and on a combination thereof. Duplicate decision performance is enhanced when information upon which a duplicate determination can be made can be found in memory rather than on disk. Therefore, the delta-index logic 146 may be configured to maintain the delta hashes 190 in a manner that increases the likelihood of finding delta hash matches in memory. For example, finding a first delta hash may cause related delta hashes to be moved from disk into memory in anticipation of processing related chunks.

One embodiment of apparatus 100 includes a chunk comparison logic 150. Chunk comparison logic 150 is configured to identify a difference between the chunk being processed by apparatus 100 and a stored chunk. The chunk comparison logic 150 may perform techniques including, but not limited to, a byte by byte comparison, a bit by bit comparison, and a block by block comparison. The stored chunk may be stored in a data store 199. Since the crypto-index logic 144 and the delta-index logic 146 can search different indexes in parallel, a stored chunk may be first identified by the crypto-index logic 144 and/or the delta-index logic 146. In one example, if the crypto-index logic 144 identifies a stored chunk as being a duplicate of the chunk being processed by apparatus 100, then crypto-index logic 144 may cause the search of the delta hashes to be terminated. Additionally, if the delta-index logic 146 determines that the chunk is similar to but not identical to a stored chunk, then the delta-index logic 146 may cause the search of the crypto hashes to be terminated. Therefore, having the crypto-index logic 144 and the delta-index logic 146 operating in parallel can reduce the amount of time it takes to make a duplicate/unique/delta determination. In one example, a duplicate chunk may be treated as a delta chunk. While this may lead to additional indexing space being consumed, making the decision to treat the duplicate chunk as a delta chunk may shorten duplicate determination time.

Apparatus 100 can also include a storage logic 160. Storage logic 160 may be configured to store a delta chunk for the chunk being processed by apparatus 100. Storing the delta chunk can include storing a reference to a stored chunk, storing a rule for recreating the chunk from a stored chunk, and placing a delta hash into a delta hash index. Since the delta hash is more narrow than the crypto-hash, placing the delta hash into a delta hash index will consume less index space than storing the crypto-hash in a crypto-hash index. Additionally, storing the delta hash in a delta hash index may complete more quickly than storing a crypto-hash in a crypto-index. Thus, having apparatus 100 process delta chunks facilitates saving storage space and index space, and also facilitates making some duplicate determinations more quickly.

In one embodiment, the crypto-index logic 144 and the delta-index logic 146 are configured to control the storage logic 160 to selectively store the chunk as a delta chunk. The crypto-index logic 144 and the delta-index logic 146 base the control decision on the crypto-index logic 144 search of the index 180 that stores crypto-hashes and the delta-index logic 146 search of the index 190 that stores delta hashes. The chunk may be stored as a delta chunk even in some cases where the chunk is a duplicate chunk. In one embodiment, the chunk comparison logic 150 may also be configured to control the storage logic 160 to selectively store the chunk as a delta chunk based, at least in part, on differences identified between the chunk and a stored chunk. In one example, if the number of differences between a chunk and a stored chunk is less than a threshold then the chunk comparison logic 150 may control the storage logic 160 to treat the chunk as a delta chunk. However, if the number of differences between a chunk and a stored chunk is greater than a threshold then the chunk comparison logic 150 may control the storage logic 160 to treat the chunk as a unique chunk. However, it is not merely the number of differences between chunks that can control a delta chunk decision. A chunk may differ from a stored chunk in every position but still be treated as a delta chunk. Consider a chunk that differs from another chunk simply because the first character has been deleted. Every other character in the chunk may be similar. This chunk could be stored as a delta chunk that points to the stored chunk and includes a rule that says delete the first character of the stored chunk to recreate the delta chunk.

Apparatus 100 may also include a transmission logic 170. Recall that dedupe may be applied for both storage and transmission. Therefore transmission logic 170 may be configured to transmit a delta chunk for the chunk being processed by the apparatus 100 rather than transmitting the whole chunk or information identifying the chunk as a duplicate chunk. In one embodiment, the crypto-index logic 144 and the delta-index logic 146 are configured to control the transmission logic 170 to selectively transmit the chunk as a delta chunk. The control decision may be based, at least in part, on the crypto-index logic 144 search of the index 170 that stores crypto-hashes and the delta-index logic 146 search of the index 180 that stores delta hashes. In one embodiment, the chunk comparison logic 150 is also configured to control the transmission logic 170 to selectively transmit the chunk as a delta chunk based, at least in part, on differences between the chunk being processed and a chunk indexed in the crypto-hash index 180 or the delta-hash index 190. Recall that chunk comparison logic 150 can consider not just the number of differences between chunks but also the types of differences and whether a rule(s) can be formulated to describe how to create the chunk from a stored chunk.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations include physical manipulations of physical quantities. Usually, though not necessarily, the physical quantities take the form of electrical or magnetic signals capable of being stored, transferred, combined, compared, and otherwise manipulated in a logic. The physical manipulations transform electronic components and/or data representing physical entities from one state to another.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional, not illustrated blocks.

Figure 3:
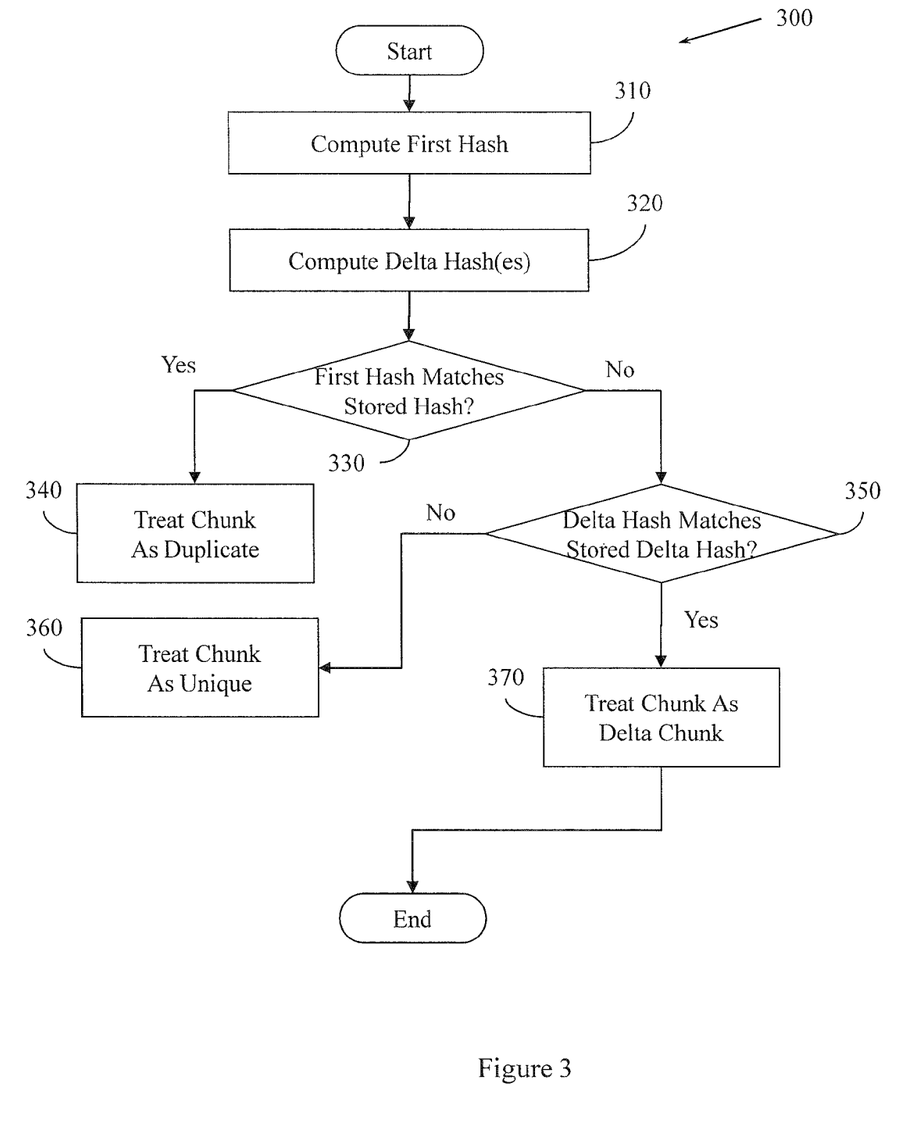
FIG. 3 illustrates an embodiment of a method associated with delta chunks and delta hashes.

FIG. 3 illustrates a method 300. Method 300 computes multiple hashes for a chunk and then makes a duplicate/unique/delta chunk determination as a function of information derived from searches based on the multiple hashes. Method 300 includes, at 310, computing a first hash for a chunk for which a duplicate determination is to be made. The duplicate chunk determination is a function of the first hash being compared to a stored first hash. For example, if the first hash matches a stored first hash then the chunk may be treated as a duplicate. However, searching an index for a match on a first hash may be time consuming. The amount of time it takes to search for a match of the first hash may depend on the width of the first hash.

Method 300 also includes, at 320, computing a delta hash for the chunk. The delta chunk determination can be made as a function of the delta hash being compared to a stored delta hash. While a single delta hash is described, multiple delta hashes may be computed. In one example, the first hash is a cryptographic hash having a first strength and a first width and the delta hash has a second strength and a second width. The first strength will be greater than the second strength and the first width will be wider than the second width. Since the delta hash will be more narrow (e.g., consume fewer bits) than the first hash, an index of delta hashes may be searchable in less time than an index of wide cryptographic hashes.

Method 300 also includes, at 330, making a determination concerning whether the first hash matches a stored hash. If the determination at 330 is Yes, then method 300 may proceed, at 340, to process the chunk as a duplicate chunk. If the determination at 330 is No, then method 300 may proceed, at 350, to make a subsequent determination concerning whether the delta hash matches a stored delta hash. If the determination at 350 is No, then method 300 may proceed, at 360, to treat the chunk as a unique chunk. If the determination at 350 is Yes, then method 300 may proceed, at 370, to treat the chunk as a delta chunk.

The stored first hash may be stored in a first index and the stored delta hash may be stored in a second, different index. Since the first hash may be wider than the delta hash, the index storing the stored delta hash may be searched more quickly than the index storing the first hash. Additionally, since the stored first hash and the stored delta hash may be stored in different indexes, they may be searched in parallel, partially in parallel, or using other non-serial techniques. This may facilitate improving duplicate determination time.

In one example, when two or more different delta hashes are computed for the chunk at 320, the determination at 350 may concern whether a threshold number of the two or more delta hashes match stored delta hashes. For example, if more than 50% of the delta hashes match, then a chunk may be treated as a delta. Therefore, method 300 may include selectively controlling the de-duplication logic to process the chunk as a delta chunk when a threshold number of delta hashes match stored delta hashes.

Figure 8:
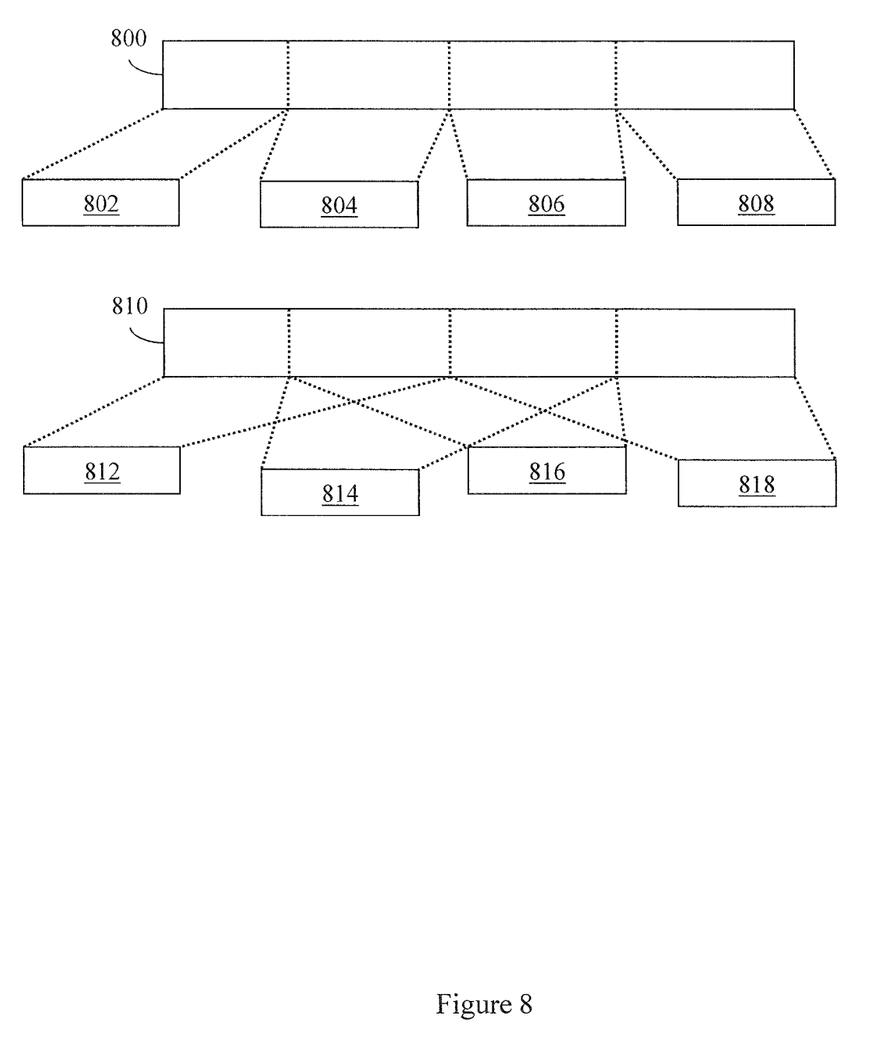
FIG. 8 illustrates computing different delta hashes for a chunk.

The two or more delta hashes can have different forms. For example, a first delta hash may be computed for a first portion of the chunk. The first portion may be less than the entire chunk but all bytes in the portion may be being contiguous within the chunk. A second delta hash may be computed for a second portion of the chunk. The second portion may also be less than the entire chunk and have all its bytes be contiguous within the chunk. The second portion may not overlap the first portion. Examples of this first delta hash and second delta hash are illustrated in FIG. 8. A chunk 800 may be divided into quarters. The first delta hash 802 may be computed for a first portion of chunk 800 while the second delta hash 804 may be computed for a second, non-overlapping portion of chunk 800. Additional non-overlapping, contiguous delta hashes 806 and 808 may also be computed.

A third delta hash may also be computed for a third portion of the chunk. The third portion may also be less than the entire chunk and have all its bytes contiguous within the chunk. However, the third portion may partially overlap the first portion. Consider chunk 810 (FIG. 8). A first delta hash 812 may be computed and a partially overlapping third hash 814 may be computed. Additional partially overlapping hashes 816 and 818 may also be computed.

One skilled in the art will also appreciate that hashes may be computed for non-contiguous portions of a chunk. For example, a fourth delta hash may be computed for a fourth portion of a chunk, where the fourth portion is less than the entire chunk and where the bytes in the fourth portion are not contiguous. Similarly, hashes for overlapping and non-overlapping portions that do not have contiguous bytes may be computed. One skilled in the art will appreciate that different types of delta hashes may be computed for different subsets of a chunk.

In one example, a method may be implemented as computer executable instructions. Thus, in one example, a computer readable medium may store computer executable instructions that if executed by a computer (e.g., data reduction server) cause the computer to perform method 300.

While executable instructions associated with method 300 are described as being stored on a computer readable medium, it is to be appreciated that executable instructions associated with other example methods described herein may also be stored on a computer readable medium.

"Computer readable medium", as used herein, refers to a medium that stores signals, instructions and/or data. A computer readable medium may take forms, including, but not limited to, non-volatile media, and volatile media. Non-volatile media may include, for example, optical disks, and magnetic disks. Volatile media may include, for example, semiconductor memories, and dynamic memory. Common forms of a computer readable medium may include, but are not limited to, a floppy disk, a flexible disk, a hard disk, a magnetic tape, other magnetic medium, an ASIC, a CD (compact disk), other optical medium, a RAM (random access memory), a ROM (read only memory), a memory chip or card, a memory stick, and other media from which a computer, a processor, or other electronic device can read.

Figure 4:
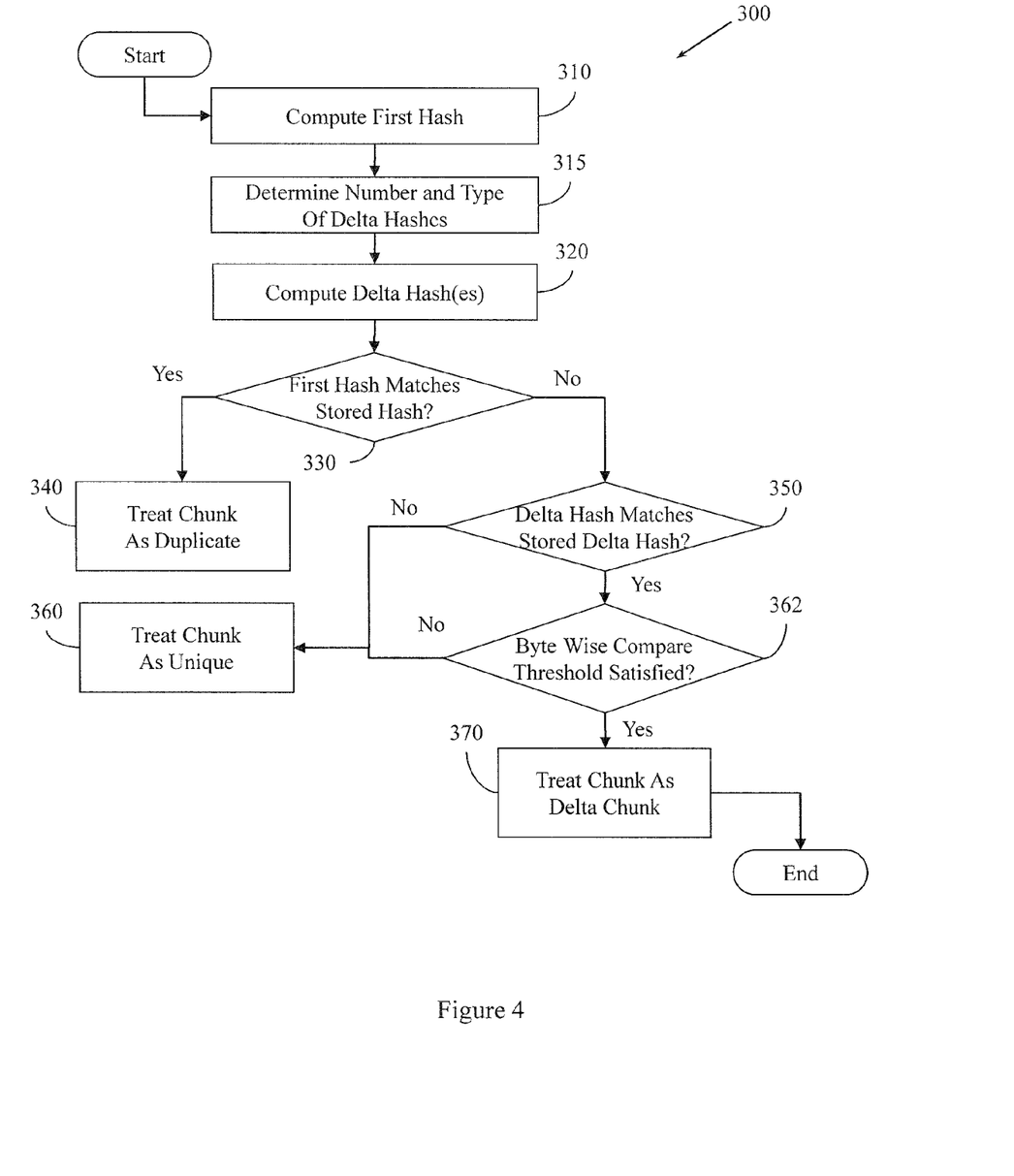
FIG. 4 illustrates an embodiment of a method associated with delta chunks and delta hashes.

FIG. 4 illustrates another embodiment of method 300. This embodiment of method 300 also includes, at 315, selectively determining a type of delta hash to compute based on attributes including, but not limited to, chunk entropy, chunk size, chunk type, and a recently determinative delta hash. The processing at 315 may also include selectively determining how many delta hashes to compute based on attributes including, but not limited to, chunk entropy, chunk size, and chunk type. Thus, method 300 can react to the size, type, and attributes of a chunk before blindly computing delta hashes. Different hashes may be more adept at identifying similarities and differences between chunks.

In one example, a hash type may be determined based on chunk entropy. Entropy is a measure of uncertainty associated with the randomness of data in an object to be data reduced. The entropy of data that is truly random is one. The entropy of a long string of duplicate characters is nearly zero. The entropy of most data falls between these two limiting examples. Different types of delta hashes may be computed based on different chunk entropy. For example, a chunk with a high entropy may reveal its similarities to other chunks using a first type of delta hash while a chunk with a low entropy may reveal its similarities to other chunks using a second type of delta hash.

This embodiment of method 300 also includes additional processing at 362 before a chunk is treated as a delta chunk. Upon determining at 350 that the delta hash matches a stored delta hash, this embodiment of method 300 may also perfoi in a byte-wise comparison of a stored chunk to the incoming chunk. While a byte-wise comparison is described, one skilled in the art will appreciate that other types of comparisons may be performed. The comparison may identify the number and/or type of differences and/or similarities between chunks. If the byte-wise comparison at 362 satisfies a threshold, then the chunk may be treated as a delta chunk at 370. Otherwise the chunk may be treated as a unique chunk at 360.

Figure 5:
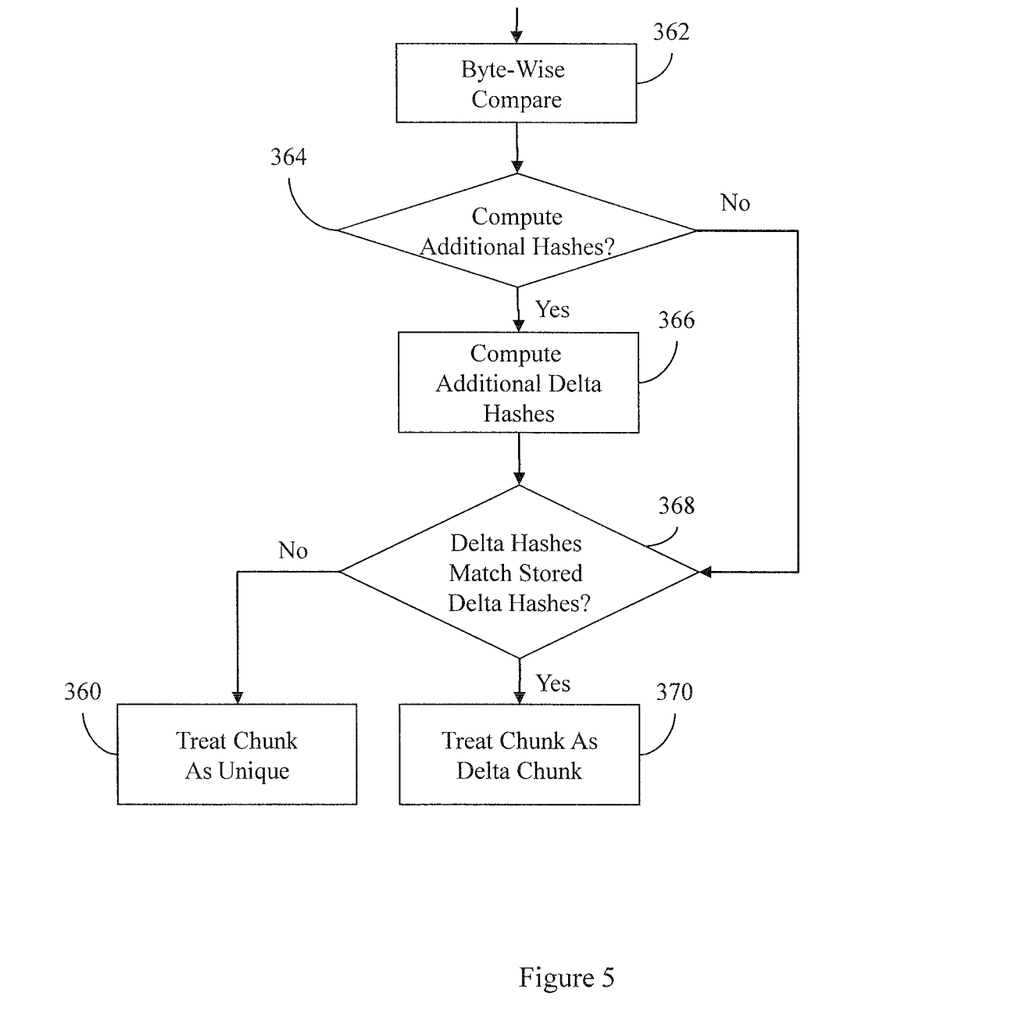
FIG. 5 illustrates an embodiment of a method associated with delta chunks and delta hashes.

FIG. 5 illustrates an embodiment of a portion of method 300. In this embodiment additional delta hashes may be computed based on information learned from comparing delta hashes to stored hashes. A byte-wise compare at 362 may provide information upon which a decision to compute additional hashes can be made at 364. If no additional hashes are to be computed then method 300 may jump ahead to 368. If additional hashes are to be computed, then method 300 may, at 366, compute those additional hashes. The additional hashes may be wider than previous hashes, may be more narrow than previous hashes, may concern different regions in a chunk, may apply different patterns to a chunk, and so on.

A decision may then be made at 368 concerning whether the delta hashes, including the newly computed delta hashes, match stored delta hashes. In one example, a threshold number of matches may be required at 368 before a chunk will be treated as a delta chunk at 370.

Figure 6:
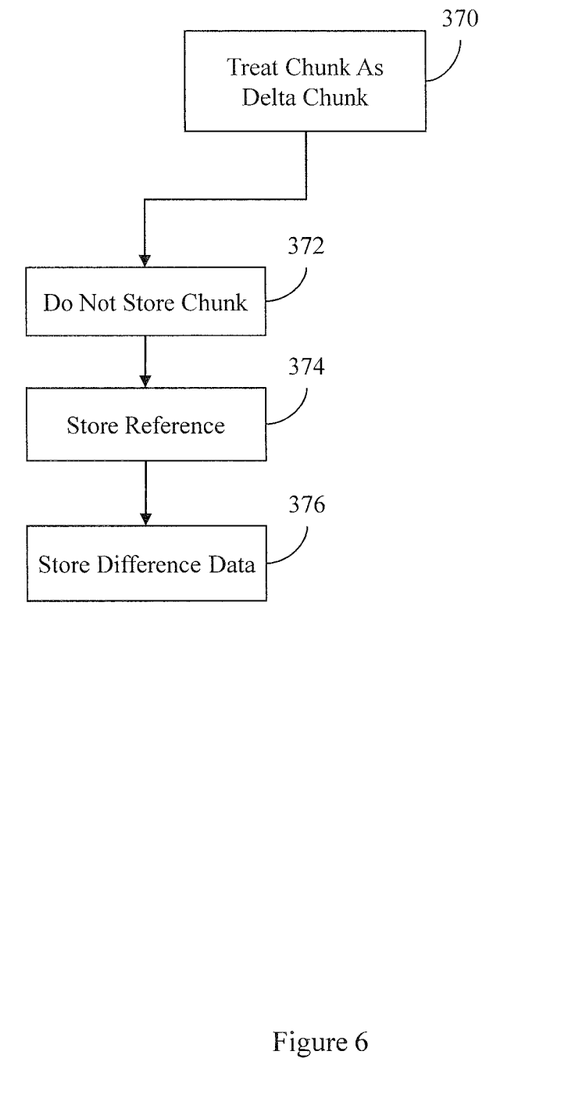
FIG. 6 illustrates an embodiment of a portion of a method associated with delta chunks and delta hashes.

FIG. 6 illustrates an embodiment of a portion of method 300. FIG. 6 provides additional detail for action 370, treating a chunk as a delta chunk. Treating a chunk as a delta chunk may include controlling a de-duplication logic at 372 to not store the chunk. While not storing a chunk is described, when a dedupe decision is being made to control data transmission, treating a chunk as a delta chunk may include controlling a de-duplication logic to not transmit the chunk. Treating a chunk as a delta chunk may also include controlling a de-duplication logic at 374 to store a reference to a stored chunk and at 376 to store a difference data. Once again, transmission rather than storage may be controlled. The difference data may describe how to create the chunk from the stored chunk. Thus, in different examples, the difference data may describe an addition to a stored chunk, a deletion from a stored chunk, and other edits to a stored chunk.

Figure 7:
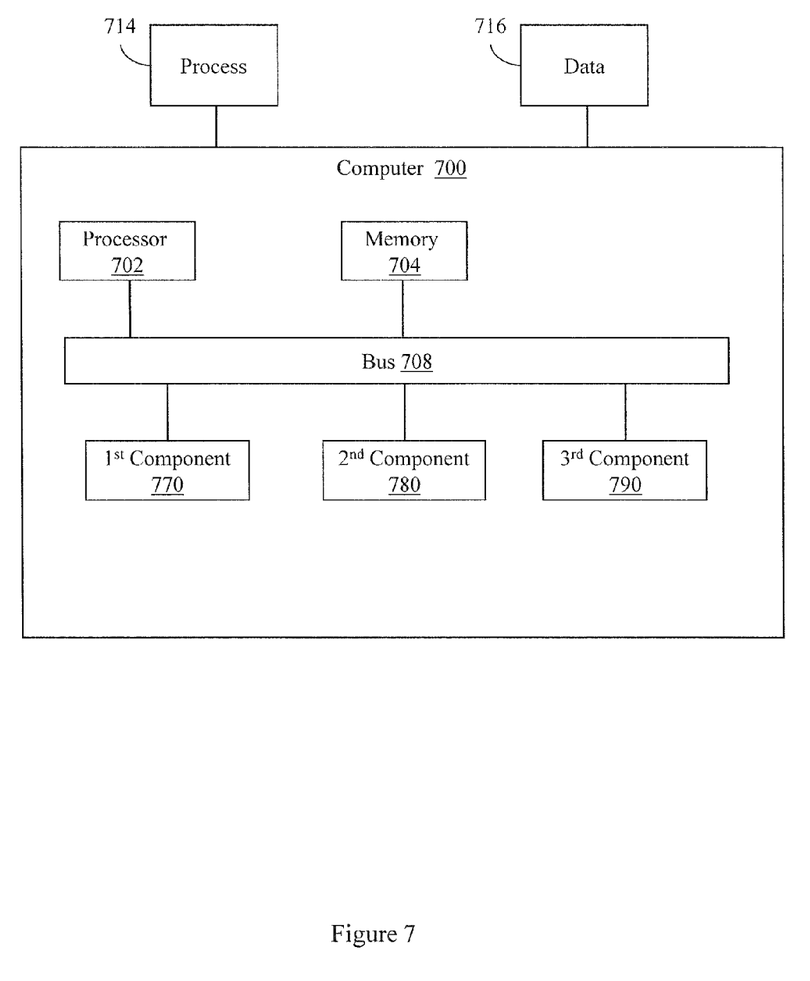
FIG. 7 illustrates an embodiment of a computer configured to control processing delta chunks using delta hashes.

FIG. 7 illustrates a computer 700. Computer 700 includes a processor 702 and a memory 704 that are operably connected by a bus 708. In one example, the computer 700 may include a first component 770 that is configured to compute multiple hashes for a chunk for which a de-duplication decision is to be made. The computer 700 can include a second component 780 that is configured to search for the multiple hashes in multiple indexes for delta information upon which the de-duplication decision can be made. The computer 700 can also include a third component 790 that is configured to selectively treat the chunk as a delta chunk based, at least in part, on the delta information. The computer 700 may treat a chunk as a delta chunk when the chunk is not a duplicate but can be recreated from a stored chunk using rules that can be stored along with a reference to the stored chunk.

Generally describing an example configuration of the computer 700, the processor 702 may be a variety of various processors including dual microprocessor and other multi-processor architectures. A memory 704 may include volatile memory (e.g., RAM (random access memory)) and/or non-volatile memory (e.g., ROM (read only memory)). The memory 704 can store a process 714 and/or a data 716, for example. The process 714 may be a data reduction process and the data 716 may be an object to be data reduced.

The bus 708 may be a single internal bus interconnect architecture and/or other bus or mesh architectures. While a single bus is illustrated, it is to be appreciated that the computer 700 may communicate with various devices, logics, and peripherals using other busses (e.g., PCIE (peripheral component interconnect express), 1394, USB (universal serial bus), Ethernet). The bus 708 can be types including, for example, a memory bus, a memory controller, a peripheral bus, an external bus, a crossbar switch, and/or a local bus.

While example apparatus, methods, and articles of manufacture have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2 d. Ed. 1995).

What is claimed is:

1. A computer readable medium storing computer executable instructions that when executed by a computer control the computer to perform a method, the method comprising:
   computing a first hash for a chunk for which a duplicate determination is to be made, where the duplicate chunk determination is a function of the first hash being compared to a stored first hash, the stored first hash being stored in a first index;
   selectively determining a type of delta hash to compute based on one or more of, chunk entropy, chunk size, chunk type, and a recently determinative delta hash;
   selectively determining how many delta hashes to compute based on one or more of, chunk entropy, chunk size, and chunk type;
   computing a delta hash for the chunk, where a delta chunk determination is to be made for the chunk, where the delta chunk determination is a function of the delta hash being compared to a stored delta hash, the stored delta hash being stored in a second, different index;
   upon determining that the first hash matches a stored first hash, controlling a deduplication logic to process the chunk as a duplicate; and
   upon determining that the first hash does not match a stored first hash and that the delta hash matches a stored delta hash, controlling the de-duplication logic to process the chunk as a delta chunk,
   where the first hash and the delta hash are computed in parallel,
   where determining that the first hash matches a stored first hash and determining that the delta hash matches a stored delta hash proceeds in parallel,
   where a definitive answer concerning the first hash causes termination of the determination proceeding in parallel concerning the delta hash, and
   where a definitive answer concerning the delta hash causes termination of the determination proceeding in parallel concerning the first hash.

2. The computer readable medium of claim 1, where the first hash is a cryptographic hash having a first strength and a first width, and where the delta hash has a second strength and a second width, the first strength being greater than the second strength, the first width being wider than the second width.

3. The computer readable medium of claim 1, the method comprising computing two or more different delta hashes for the chunk, and upon determining that a threshold number of the two or more delta hashes match stored delta hashes, controlling the de-duplication logic to process the chunk as a delta chunk.

4. The computer readable medium of claim 1, where controlling the de-duplication logic to process the chunk as a delta chunk comprises:
   controlling the de-duplication logic to not store the chunk; and
   controlling the de-duplication logic to store a delta chunk, where a delta chunk comprises a reference to a stored chunk and difference data.

5. The computer readable medium of claim 4, where the difference data describes how to create the chunk from the stored chunk.

6. The computer readable medium of claim 4, where the difference data describes one or more of, an addition to a stored chunk, a deletion from a stored chunk, and an edit to a stored chunk.

7. The computer readable medium of claim 1, the method comprising:
   upon determining that the delta hash matches a stored delta hash,
   controlling the de-duplication logic to treat the chunk as a delta chunk upon determining that a byte-wise comparison of the chunk and a stored chunk associated with the delta hash satisfies a threshold.

8. The computer readable medium of claim 1, the method comprising computing one or more subsequent delta hashes based on information gathered from comparing the delta hash to stored delta hashes and controlling the de-duplication logic to process the chunk as a delta chunk as a function of the subsequent delta hashes.

9. The computer readable medium of claim 3, the two or more delta hashes comprising one or more of:
   a first delta hash for a first portion of the chunk, the first portion being less than the entire chunk, the first portion being contiguous within the chunk;
   a second delta hash for a second portion of the chunk, the second portion being less than the entire chunk, the second portion being contiguous within the chunk, the second portion not overlapping the first portion;
   a third delta hash for a third portion of the chunk, the third portion being less than the entire chunk, the third portion being contiguous within the chunk, the third portion partially overlapping the first portion;
   a fourth delta hash for a fourth portion of the chunk, the fourth portion being less than the entire chunk, the fourth portion not being contiguous within the chunk;
   a fifth delta hash for a fifth portion of the chunk, the fifth portion being less than the entire chunk, the fifth portion not being contiguous within the chunk, the fifth portion not overlapping the fourth portion; and
   a sixth delta hash for a sixth portion of the chunk, the sixth portion being less than the entire chunk, the sixth portion not being contiguous within the chunk, the sixth portion partially overlapping the fourth portion.

* * * * *

UNITED STATES PATENT AND TRADEMARK OFFICE
CERTIFICATE OF CORRECTION

| | | |
|---|---|---|
| PATENT NO. | : 8,489,611 B2 | Page 1 of 1 |
| APPLICATION NO. | : 13/182495 | |
| DATED | : July 16, 2013 | |
| INVENTOR(S) | : Jeffrey Vincent Tofano | |

It is certified that error appears in the above-identified patent and that said Letters Patent is hereby corrected as shown below:

In the Specification:

In column 5, line 17, delete "used recreate" and insert --used to recreate--.

In column 8, line 33, delete "be being contiguous" and insert --be contiguous--.

In column 9, line 47, delete "perfoi in" and insert --perform--.

Signed and Sealed this
Fifth Day of November, 2013

Teresa Stanek Rea
*Deputy Director of the United States Patent and Trademark Office*